(12) United States Patent
Tsuchiya

(10) Patent No.: US 8,450,924 B2
(45) Date of Patent: *May 28, 2013

(54) LIGHT-EMITTING DEVICE AND METHOD FOR MANUFACTURING THE SAME

(75) Inventor: Kaoru Tsuchiya, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 41 days.

This patent is subject to a terminal disclaimer.

(21) Appl. No.: 13/091,423

(22) Filed: Apr. 21, 2011

(65) Prior Publication Data

US 2011/0193129 A1     Aug. 11, 2011

Related U.S. Application Data

(63) Continuation of application No. 12/358,947, filed on Jan. 23, 2009, now Pat. No. 7,932,667, which is a continuation of application No. 11/417,815, filed on May 3, 2006, now Pat. No. 7,488,985, which is a continuation of application No. 10/740,274, filed on Dec. 18, 2003, now Pat. No. 7,045,822.

(30) Foreign Application Priority Data

Dec. 25, 2002    (JP) ................................ 2002-375672

(51) Int. Cl.
*H01L 51/50*      (2006.01)
*H01L 51/52*      (2006.01)

(52) U.S. Cl.
USPC ............ 313/503; 313/506; 313/509; 313/512

(58) Field of Classification Search
USPC .................................................. 313/498–512
See application file for complete search history.

(56) References Cited

U.S. PATENT DOCUMENTS

| | | | |
|---|---|---|---|
| 5,652,067 | A | 7/1997 | Ito et al. |
| 6,137,223 | A | 10/2000 | Hung et al. |
| 6,140,763 | A | 10/2000 | Hung et al. |
| 6,579,629 | B1 | 6/2003 | Raychaudhuri et al. |

(Continued)

FOREIGN PATENT DOCUMENTS

| | | |
|---|---|---|
| EP | 1 179 862 A2 | 2/2002 |
| JP | 2001-52863 | 2/2001 |

(Continued)

OTHER PUBLICATIONS

Kawaharada, M. et al, "Nuclei of Dark Spots in Organic EL Devices: Detection by DFM and Observation of the Microstructure by TEM," Synthetic Metals, vol. 91, 1997, pp. 113-116.

(Continued)

*Primary Examiner* — Mariceli Santiago
(74) *Attorney, Agent, or Firm* — Husch Blackwell LLP

(57) ABSTRACT

The present invention provides an organic light-emitting element where a lower electrode, an organic compound layer and an upper electrode are laminated on a substrate, wherein the upper electrode of the organic EL element is formed by a laminate of at least a conductive first inorganic film, a conductive organic film and a conductive second inorganic film, in order to suppress the occurrence of dark spot, so that the occurrence of pinholes in the upper electrode leading to dark spots is suppressed. Here, pinholes refer to holes in the upper electrode that penetrate upper electrode from the organic compound layer underneath to the atmosphere above.

30 Claims, 3 Drawing Sheets

U.S. PATENT DOCUMENTS

| | | |
|---|---|---|
| 6,628,086 B2 | 9/2003 | Hayashi et al. |
| 6,876,018 B2 * | 4/2005 | Ko ................................ 257/290 |
| 7,045,822 B2 * | 5/2006 | Tsuchiya ......................... 257/79 |
| 7,488,985 B2 | 2/2009 | Tsuchiya |
| 7,932,667 B2 * | 4/2011 | Tsuchiya ..................... 313/503 |
| 2002/0036291 A1 | 3/2002 | Parker et al. |
| 2002/0158588 A1 | 10/2002 | Hayashi et al. |
| 2002/0167007 A1 | 11/2002 | Yamazaki et al. |
| 2003/0146436 A1 | 8/2003 | Parker et al. |

FOREIGN PATENT DOCUMENTS

| | | |
|---|---|---|
| JP | 2002-75658 | 3/2002 |
| JP | 2002-252088 | 9/2002 |
| JP | 2002-270378 | 9/2002 |
| JP | 2003-68470 | 3/2003 |
| JP | 2003-282273 | 10/2003 |
| JP | 2003-303681 | 10/2003 |
| JP | 2003-536227 | 12/2003 |
| WO | WO 01/99207 A2 | 12/2001 |

OTHER PUBLICATIONS

Liew, Y-F. et al, "Investigation of the Sites of Dark Spots in Organic Light-Emitting Devices," Applied Physics Letters, vol. 77, No. 17, Oct. 23, 2000, pp. 2650-2652.

International Search Report re application No. PCT/JP03/16166, dated Feb. 3, 2004.

Written Opinion re application No. PCT/JP03/16166, dated Mar. 9, 2004 (with partial English translation).

International Preliminary Examination report re application No. PCT/JP03/16166, dated Jun. 15, 2004 (with partial English translation).

* cited by examiner

FORMATION OF ACTIVE MATRIX SUBSTRATE

FORMATION OF LAYER INCLUDING ORGANIC COMPOUND AND CATHODE

LIGHT-EMITTING DEVICE AND METHOD FOR MANUFACTURING THE SAME

This application is a continuation of application Ser. No. 12/358,947 filed on Jan. 23, 2009 now U.S. Pat. No. 7,932,667 which is a continuation of application Ser. No. 11/417,815 filed on May 3, 2006 (now U.S. Pat. No. 7,488,985 issued Feb. 10, 2009) which is a continuation of application Ser. No. 10/740,274 filed on Dec. 18, 2003 (now U.S. Pat. No. 7,045,822 issued May 16, 2006).

TECHNICAL FIELD

The present invention relates to a light-emitting device including a light-emitting element, where a layer that includes an organic compound such as an organic electroluminescence (abbreviated below as EL) material is intervened between a pair of electrodes, and in particular to an electrode structure of the light-emitting element.

BACKGROUND ART

In recent years, the application, to next-generation flat panel displays, of light-emitting elements using an organic EL material having characteristics such as thinness, light weight, high-speed responsiveness and direct-current low-voltage driving has been expected. The light-emission mechanism of the light-emitting element is such that an organic compound layer is sandwiched between a pair of electrodes and a voltage is applied thereto, whereby electrons implanted from a cathode and holes injected from an anode are recombined at a light-emitting center in the organic compound layer to form molecular excitons, so that the molecular excitons release energy and emit light when they return to the ground state. It is recognized that the biggest problem in utilizing light-emitting elements using an organic EL material is improving their reliability with the main purpose of extending their light-emitting lifetime.

It is thought that the reasons light-emitting elements using an organic EL element deteriorate are that the constituent material itself deteriorates due to applying an electric field thereto and driving the light-emitting elements, and that the junction state at boundaries of the films configuring the light-emitting elements physically and chemically change. Also, even when the light-emitting elements are simply stored without driving them, they end up deteriorating due to heat, moisture, oxygen, physical shock and sunlight from the outside. Among deterioration resulting from these external factors, deterioration resulting from moisture and oxygen is particularly remarkable.

Dark spots are one example of a poor light-emission phenomenon of light-emitting elements using an organic EL material, and arise due to moisture and oxygen present in the atmosphere. Dark spots are a phenomenon where the light-emission luminance drops locally, and are observed as tiny black spots present in the pixels at the stage immediately after the fabrication of the light-emitting element. It is known that dark spots, which are of a size that is initially imperceptible, grow by driving or storing over a long period of time light-emitting elements using an organic EL material. The main causes of dark spots are moisture and oxygen that penetrate the organic layer through holes (pinholes) formed in the upper electrode. FIG. 2 is an optical microscope photograph of such a dark spot that is frequently observed. FIG. 2 shows the presence of a dark spot 202 in a part (the region encircled by the dotted line in the drawing) of pixels 201 where light-emitting elements using an organic EL material are arranged in a matrix.

FIG. 5 shows the cross-sectional structure of such a light-emitting element, and schematically shows the reason dark spots arise. Reference numeral 501 is a lower electrode, reference numeral 502 is an organic compound layer, and reference numeral 503 is an upper electrode. Dark spots arise due to moisture and oxygen penetrating the organic compound layer through a pinhole 504 that is present in the upper electrode 503 and penetrates the upper electrode 503 as far as the organic compound layer. It is thought that such pinholes arise due to foreign matter, unevenness of the lower electrode, unevenness resulting from crystallization of the organic material (particularly low Tg hole transport material) and crystal grain boundaries.

In an active matrix type light-emitting device, in order to form pixels with thin film transistors (abbreviated below as TFT) and light-emitting elements, several layers of films are formed under the light-emitting element, and there is the potential for foreign matter to adhere to these films during each film-forming process and during conveyance of the substrate. Sometimes foreign matter also adheres to the substrate surface during the film formation of the lower electrode, the organic compound layer and the upper electrode configuring the light-emitting element. Pinholes form in the upper electrode surface if the upper electrode does not completely cover surface unevenness resulting from the foreign matter (e.g., see Non-Patent Document 1).

Non-Patent Document 1
*Synthetic Metals*, Vol. 91, p. 113 (1997)

Spike-shaped bumps of several nm to several tens nm are present on the surface of an ITO film frequently used as the lower electrode of a light-emitting element. The size of the bumps on the conductive ITO film surface is large, and the bumps can lead to point defects when the ITO and the upper electrode short-circuit, but they can also result in dark spots when they are of a size that will not short-circuit and are not completely covered by the upper electrode.

It is known that, for the above-described reasons, many pinholes are present in aluminum film commonly used as the upper electrode. It is said that there are many pinholes in aluminum film formed by deposition, which is frequently used particularly because it does not damage the organic layer during film formation.

Separation of the upper electrode and the organic layer is recognized as a mechanism where moisture penetrating through the pinholes triggers a drop in luminance (see Non-Patent Document 2), and sometimes the mechanism of deterioration itself is dependent on the material configuring the light-emitting element using an organic EL material, but this mechanism is not completely understood.

Non-Patent Document 2
*Applied Physics Letters*, Vol. 77, No. 17, p. 2650 (2000)

As one example of a technique for reducing pinholes in the upper electrode, a technique has been disclosed where a low-melting point metal is deposited on a metal electrode layer formed on an organic light-emitting layer of an element using an organic EL material, and the deposited metal is melted to form shield metal that fills in the pinholes in the metal electrode layer (e.g., see Patent Document 1).

Patent Document 1
Japanese Patent Laid-Open No. 2001-52863

DISCLOSURE OF THE INVENTION

However, in the method that deposits and melts a second electrode in order to fill in pinholes present in the first electrode layer, the heating temperature necessary therefor becomes a problem. Indium, gallium, an alloy thereof, and an alloy of lead or aluminum and gallium are used for the metal for the second electrode, but the melting point of gallium is 29° C., the melting point of indium is 154° C., and the melting point of lead is 327° C.

When a metal whose melting point is near room temperature, such as gallium, is used to form the second electrode, there is the potential for the electrode to become unstable due to the light-emitting element giving off heat as the light-emitting element is driven. When a material with a high melting point is used as the second electrode, there is the potential for the light-emitting element to be damaged because it is necessary to heat the element at a high temperature at the time the electrode is formed. For example, the Tg of the hole transport layer usually has a low value of 60° C. to 150° C. When the light-emitting element is heated at a temperature near Tg, the hole transport layer crystallizes and the stability of the element ends up being lost.

Thus, in order to reduce pinholes present in the upper electrode without damaging the light-emitting element, an upper electrode forming method is needed where it is not necessary to heat the element at a high temperature and whose film properties do not become unstable at a low temperature.

In light of this problem, it is an object of the present invention to fabricate a highly reliable light-emitting element with which can be obtained high-quality light emission with no unevenness, even when the element is stored for a long period of time, by suppressing the occurrence of pinholes that lead to dark spots.

In order to solve this problem, in the present invention, an upper electrode of a light-emitting device is formed by a laminate of at least a conductive first inorganic film, a conductive organic film and a conductive second inorganic film, so that the occurrence of pinholes in the upper electrode that lead to dark spots is suppressed. Here, the conductive inorganic films are metal films or transparent conductive films. Also, pinholes refer to holes in the upper electrode that penetrate upper electrode from the organic compound layer underneath to the atmosphere above.

FIG. 1 shows a schematic diagram of the invention. Reference numeral 101 is a lower electrode, reference numeral 102 is a layer including an organic compound (also called an EL layer), reference numerals 103 to 105 correspond to an upper electrode, with reference numeral 103 being at least a conductive first inorganic film, reference numeral 104 being a conductive organic film and reference numeral 105 being a conductive second inorganic film. Reference numerals 103 and 105 are configured by inorganic films in which pinholes arise, such as indicated by reference numerals 106 and 107. However, the invention has a configuration that can block, with the conductive organic layer, the path of penetration of moisture and oxygen to the layer 102 including the organic compound.

Specifically, the conductive organic film 104 lengthens the path of penetration of moisture and oxygen between the pinhole 107 in the conductive second inorganic film and the pinhole 106 in the conductive first inorganic film and also fulfills a role as an absorbent. As a result, the probability that moisture from the outside will pass through the pinhole 106 in the first inorganic film and reach the organic compound layer 102 under the upper electrode is reduced. Thus, the probability for dark spots to arise is reduced and higher quality image display is obtained. Also, by laminating a similar structure, the path of penetration of moisture and oxygen to the organic compound layer is lengthened, so that laminating several layers of the conductive organic film and the conductive inorganic films is also effective for preventing the element from deteriorating.

The present invention is a light-emitting device comprising, on a substrate including an insulating surface, a light-emitting element that includes a lower electrode, a layer including an organic compound that contacts the lower electrode, and an upper electrode that contacts the layer including the organic compound, wherein the upper electrode is formed by sequentially laminating a conductive first inorganic film, a conductive organic film and a conductive second inorganic film.

The present invention is a light-emitting device where a light-emitting element that includes a lower electrode, a layer including an organic compound that contacts the lower electrode and an upper electrode that contacts the layer including the organic compound is sandwiched between a first substrate and a second substrate, wherein the upper electrode of the light-emitting element disposed on the first substrate comprises a conductive first inorganic film, a conductive organic film and a conductive second inorganic film, and emission light from the light-emitting element is transmitted and emitted through the second substrate.

The present invention is also a light-emitting device where a light-emitting element that includes a lower electrode, a layer including an organic compound that contacts the lower electrode and an upper electrode that contacts the layer including the organic compound is sandwiched between a first substrate and a second substrate, wherein the upper electrode of the light-emitting element disposed on the first substrate is configured a conductive first inorganic film, a conductive organic film and a conductive second inorganic film, and emission light from the light-emitting element is transmitted and emitted through the first substrate.

In the present invention, the upper electrode of the light-emitting element can be one where the first inorganic film and the second inorganic film are formed by a metal, or one where the first inorganic film and the second inorganic film are formed by a transparent conductive film or a laminate of a thin metal film and a transparent conductive film.

The first inorganic film can be formed by a material including an alkali metal or an alloy or compound including an alkali metal or an alkaline earth metal or an alloy or compound including an alkaline earth metal. Alternatively, the first inorganic film can be formed by a material including a first layer including an alkali metal or an alloy or compound including an alkali metal and a second layer comprising a conductive material having a higher work function than that of the alkali metal or the alloy or compound including an alkali metal.

Also, an organic film may be hygroscopic, and is preferably formed by a conductive resin film. As another embodiment, the organic film may include an alkali metal or an alkaline earth metal, or an alkali metal, an alkaline earth metal and a transition metal including a rare earth metal. The organic film may also be translucent.

As an embodiment of the upper electrode, it is preferable for end surfaces of the organic film to be covered by the second inorganic film.

The present invention is also a manufacturing method of a light-emitting device comprising, on a substrate including an insulating surface, a light-emitting element that includes a thin film transistor, a lower electrode, a layer including an organic compound that contacts the lower electrode and an upper electrode that contacts the layer including the organic compound, the method comprising: a first step of forming the lower electrode contacting the thin film transistor on the substrate; a second step of forming the layer including the organic compound on the lower electrode; and a third step of forming the upper electrode on the layer including the organic compound, wherein the third step of forming the upper electrode includes a first substep of forming a conductive first inorganic film, a second substep of forming a conductive organic film on the first inorganic film and a third substep of forming a conductive second inorganic film on the organic film. In the second substep, the organic film is formed by coating or deposition.

According to the present invention, a light-emitting device without dark spots can be completed. As a result, a highly reliable light-emitting device can be realized.

BEST MODE FOR CARRYING OUT THE INVENTION

An embodiment mode of the invention is described in detail below using the drawings. Although it is possible to implement the invention in many different aspects, here, as one representative mode, an example is described below where a cathode and a layer including an organic compound are formed on an active matrix substrate where anodes (ITO) connected to a TFT are arranged in a matrix.

Embodiment Mode 1

Figure 1:
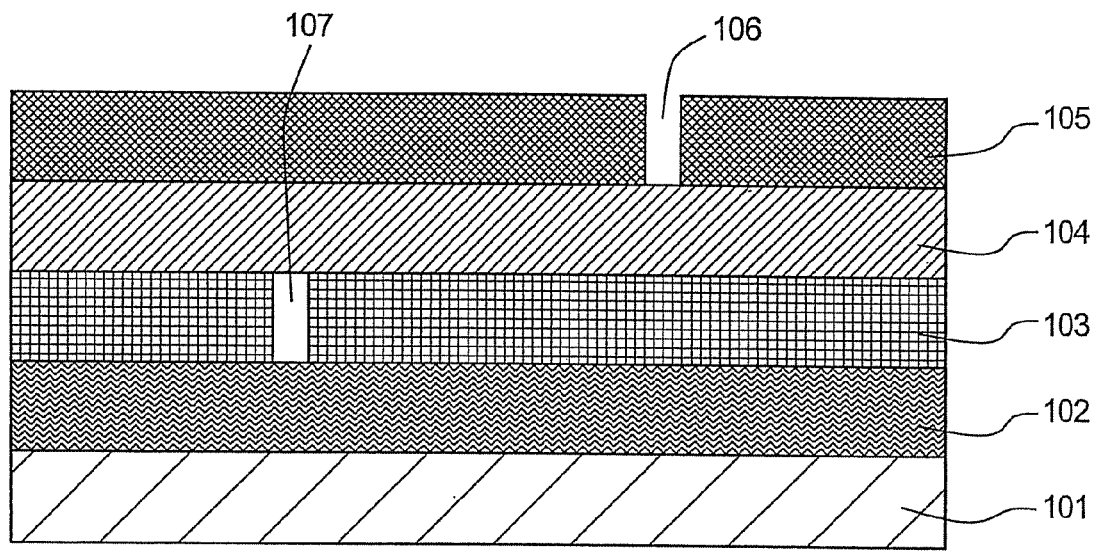
FIG. 1 is a schematic diagram showing means for solving the problem.
Figure 2:
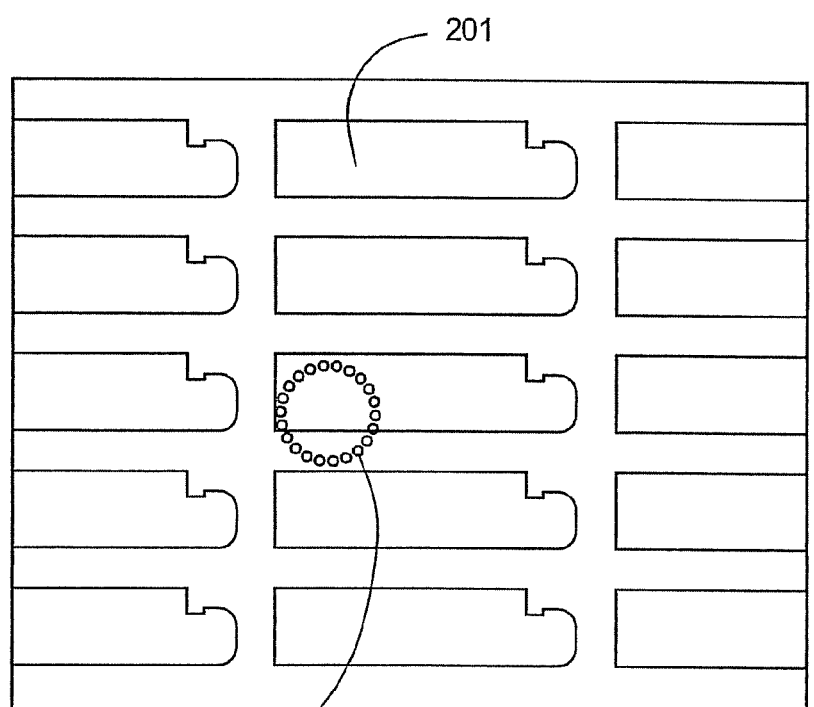
FIG. 2 is a microscopic photograph of a dark spot.
Figure 3A:
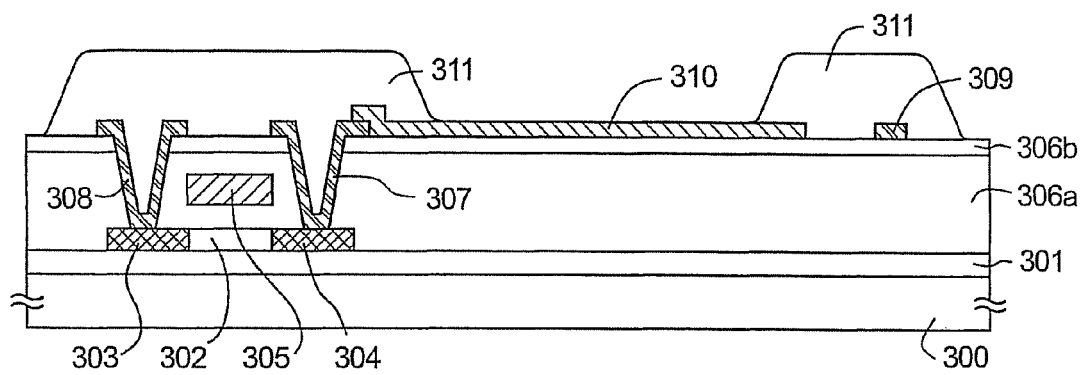
FIG. 3 are diagrams showing an example of a process representing an embodiment mode.
Figure 3B:
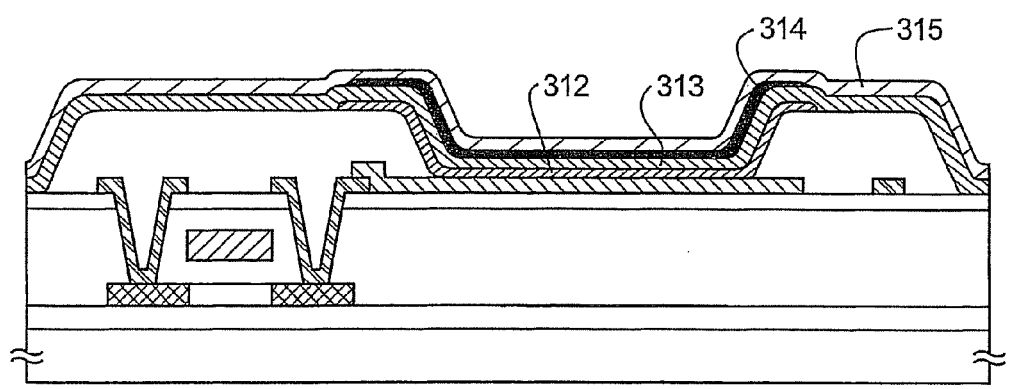

As shown in FIG. 3(A), a base film 301 is formed on a substrate 300 including an insulating surface. Next, a TFT is formed. An anode (pixel electrode) 310 connected to a drain electrode or a source electrode 308 and 307 of the TFT is formed. A metal with a large work function (Pt, Cr, W, Ni, Zn, Sn, In) is used as the anode. In the present embodiment, a conductive film comprising ITO formed by sputtering is used. The TFT comprises a gate electrode 305, a channel forming region 302, a source region or a drain region 303 and 304, the drain electrode or the source electrode 308 and 307, and insulating films 306a and 306b. Here, a p-channel type TFT, which is a semiconductor film (representatively, a polysilicon film) where the channel forming region is a crystalline structure, is described as an example of the TFT.

The uppermost layer of the interlayer insulating film of the TFT, i.e., the insulating layer 306b contacting the lower surface of the anode 310 is an inorganic insulating film (representatively, a silicon nitride film formed by radio-frequency (RF) sputtering). By disposing an inorganic insulating film with excellent coverage, cracks in the anode formed thereabove can be eliminated. Also, by using an inorganic insulating film, the moisture absorbed at the surface can be reduced.

The silicon nitride film formed by RF sputtering is a fine film using silicon as a target, the speed of etching using LAL500 is 0.77 nm/min to 8.6 nm/min, which is slow, and the hydrogen concentration in the film is $1 \times 10^{21}$ atoms/cm$^3$ as measured by secondary ion mass spectrometry (SIMS). By LAL500 is meant "LAL500 SA buffered hydrofluoric acid" made by Hashimoto Chemical Co., Ltd., and is an aqueous solution of $NH_4HF_2$ (7.13%) and $NH_4F$ (15.4%). Also, with the silicon nitride film formed by RF sputtering, there is almost no difference in the shift of C-V characteristics before and after a BT stress test, and alkali metals and impurities can be blocked.

Also, by using an organic resin film as the interlayer insulating film 306a, flatness can be improved. When a silicon oxide film, a silicon oxynitride film or a silicon nitride film formed by plasma CVD or sputtering is used instead of an organic resin film, the occurrence of a non-light-emitting region immediately after manufacturing the light-emitting element and expansion of the non-light-emitting regions do not arise, and cracks in the anode can also be eliminated.

Next, dividers 311 that cover end portions of the anode 310 are formed. The dividers 311 are formed to cover the contact holes of the TFT and a wiring 309, and to maintain the insulation between adjacent pixels and the wiring. An inorganic material (silicon oxide, silicon nitride, silicon oxide nitride, etc.), a photosensitive or non-photosensitive organic material (polyimide, acryl, polyamide, polyimideamide, a resist, or benzocyclobutene), or a laminate of these can be used for the dividers 311, but here a photosensitive organic resin is used. For example, when a positive-type photosensitive acryl is used as the material of the organic resin, it is preferable to impart a curved surface having a curvature radius at only the upper end portion of the insulator. A negative type that becomes insoluble in the etchant due to photosensitive light and a positive type that becomes soluble in the etchant due to light can both be used.

Also, the dividers 311 may be covered with a protective film comprising an aluminum nitride film, an aluminum oxynitride film or a silicon nitride film. By covering the dividers 311 with a protective film comprising an inorganic resin film, the moisture absorbed at the surface can be reduced. When the interlayer insulating film is an organic material, moisture penetrating the panel through the interlayer insulating film can be prevented from penetrating the organic compound layer.

Next, the surface of the anode 310 is cleaned. Here, in order to remove micro-grains present on the surface of the anode, the anode surface is scrubbed and cleaned with a porous sponge (representatively, made of PVA (polyvinyl alcohol) or nylon) containing a surfactant (weakly alkaline). By scrubbing and cleaning the anode surface, point defects resulting from micro-grains and dark spots can be reduced, and the abnormality where light emission efficiency drops extremely when the element is driven with a low voltage (3 V to 5 V) can be eliminated. Here, an example was described where the anode was cleaned after the dividers 311 were formed, but the anode may also be cleaned before the dividers 311 are formed or both before and after the dividers 311 are formed.

Also, a layer including an organic compound 312 is formed using deposition or coating. In order to improve reliability, it is preferable to conduct vacuum heating (100° C. to 250° C.) and conduct deaeration immediately before the layer 312 including the organic compound is formed. For example, when deposition is used, deposition is conducted in an evacuated film-forming chamber whose degree of vacuum is $5 \times 10^{-3}$ Torr (0.665 Pa) or less and preferably $10^{-4}$ to $10^{-6}$ Pa. At the time of deposition, the organic compound is first gasified by resistance heating and then dispersed in the direction of the substrate due to a shutter opening at the time of deposition. The gasified organic compound is dispersed upwards, passes through an open portion disposed in a metal mask and is deposited on the substrate. A polymer material, a low-molecular weight material, an inorganic material, a layer in which these are mixed, a layer in which these are dispersed, or a laminate in which these layers are appropriately combined may be used as the layer 312 including the organic compound.

Reference numeral 313 is a cathode first layer. As the conductive inorganic film forming the cathode first layer, it is preferable to select a material that is stable and whose electron donating property to an underlayer electron transporting layer and an electron injecting layer is high, i.e., whose work function is low. An alloy of an alkali metal or alkaline earth metal and a non-corrosive metal such as aluminum can be used as the material. A laminate film of alloys of these and a non-corrosive metal or an alloy thereof may also be used. Depending on the selection of the electron injecting layer, aluminum, a metal with a higher work function than that of aluminum and an alloy thereof can be used directly on the electron injecting layer. A laminate film thereof can also be used. The material used for the cathode first layer is not limited to these as long as it is a material whose electron donating property to the layer 312 including the organic compound of the underlayer is high. Also, if the element is an upper surface emission type or both surfaces emission type, a thin metal film, a transparent conductive film, or a laminate thereof can be used for the cathode.

With respect to the film-forming method of the cathode first layer, it is preferable to conduct deposition using resistance heating or to use sputtering because, in deposition using an electron beam, the TFT is damaged by X-rays emitted at the time of deposition.

A conductive organic material is used as a cathode second layer 314. It is preferable for the conductive organic material to be a highly hygroscopic material in order to suppress moisture passing through pinholes in a cathode third layer and penetrating the cathode second layer from penetrating the cathode first layer. In the present embodiment mode, it is preferable to use a material whose electron transportation property is high as the conductive organic material because the upper electrode is a cathode. The conductive organic material forming the cathode second layer can be doped with an alkali metal, an alkaline earth metal or a transition metal such as a rare earth metal in order to improve the conductivity of the organic material and improve electrical contact with the inorganic material.

For the cathode second layer, it is preferable to form a film of a conductive resin by coating. By coating is meant spin-coating, spraying, screen printing or painting. By applying a conductive resin as the organic compound of the second layer, not only pinholes resulting from crystal grain boundaries but also pinholes present in the cathode of the first layer resulting from base unevenness and foreign matter can be covered and the surface of the second layer can be flattened. With this method, pinholes resulting from foreign matter, base unevenness and crystal grain boundaries can be reduced in the cathode overall, and it is possible to prevent dark spots from arising. Also, because the cathode surface is flattened, coverage when conducting film sealing above the element becomes better.

A depositable organic material can also be used as the cathode second layer. In particular, it is possible to use the same material as that used for the layer 312 including the organic compound. Coverage with respect to foreign matter and ITO unevenness is not as good as that of a coated film, but pinholes resulting from crystal grain boundaries are reduced by using an amorphous film with no pinholes. By using an organic film that has good coverage with respect to unevenness in this case, it is possible to also reduce dark spots resulting from foreign matter and ITO unevenness.

In the case of an upper surface light-emitting element, it is preferable for the cathode of the second layer to be transparent in the visible light region.

As a third layer cathode 315, it is preferable to use aluminum or a material that is more difficult to oxidize than aluminum (high work function). Aluminum or the material that is more difficult to oxidize than aluminum may be used singly or an alloy thereof may be used. It is also possible to use a laminate film of these. The material used for the cathode third layer is not limited to the above materials.

The cathode of the third layer is preferably formed so that end surfaces of the conductive organic material of the second layer are covered in order to prevent moisture and oxygen from penetrating those end portions to the pixel portion. If an insulating passivation film is present on the cathode, the end surfaces of the organic layer of the second layer may be covered with the passivation film.

It is preferable to form the cathode of the third layer with sputtering that can form a fine film. The third layer cathode can also be formed using deposition.

Due to the above processes, a light-emitting element in which there are no dark spots, and in which luminance deterioration resulting from moisture, such as luminance deterioration from the pixel periphery or luminance deterioration from the panel periphery, is suppressed, can be formed.

Embodiment

Embodiment 1

Figure 4A:
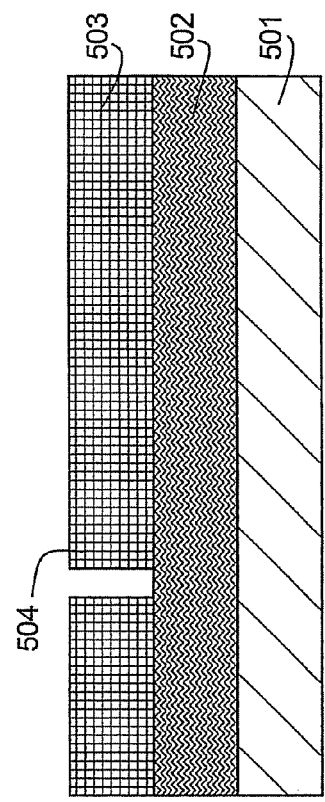
FIG. 4 are a top view and a cross-sectional view showing Embodiment 1.
Figure 5:
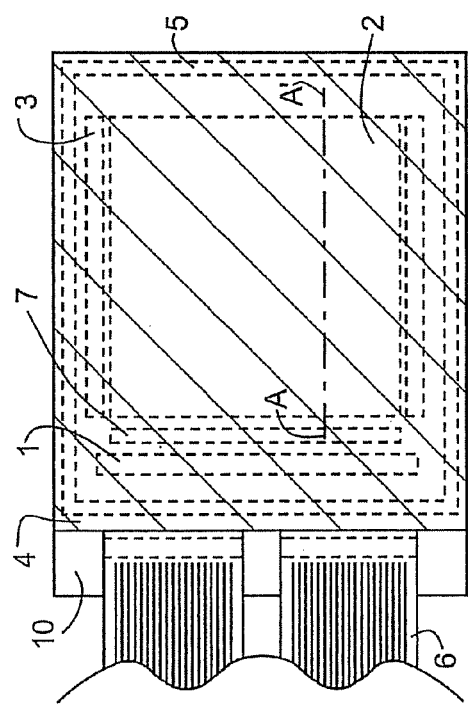
FIG. 5 is a schematic diagram showing a conventional light-emitting element.

The configuration of an active matrix type light-emitting device in which a TFT is disposed on each pixel is described as an embodiment of the invention. FIG. 4(A) is a top view thereof and FIG. 4(B) is a cross-sectional view cut along chain line A-A'.

In FIG. 4(A), reference numeral 1 is a source signal line driving circuit, reference numeral 2 is a pixel portion and reference numeral 3 is a gate signal line driving circuit. Also, reference numeral 4 is a sealing substrate, reference numeral 5 is a sealant, and the inner area surrounded by the sealant 5 serves as a space filled with an inert gas dried by a desiccant (not shown). Reference numeral 7 is a connection region where an upper electrode shared by light-emitting elements is connected to wiring on the substrate.

Video signals and clock signals are received from an FPC (flexible printed circuit) 6 serving as an external input terminal. Here, only the FPC is shown, but a printed wiring board (PWB) may also be attached to the FPC. The light-emitting device in this specification includes not only a main body of the light-emitting device but also a device including a state where an FPC or PWB is attached thereto.

Figure 4B:
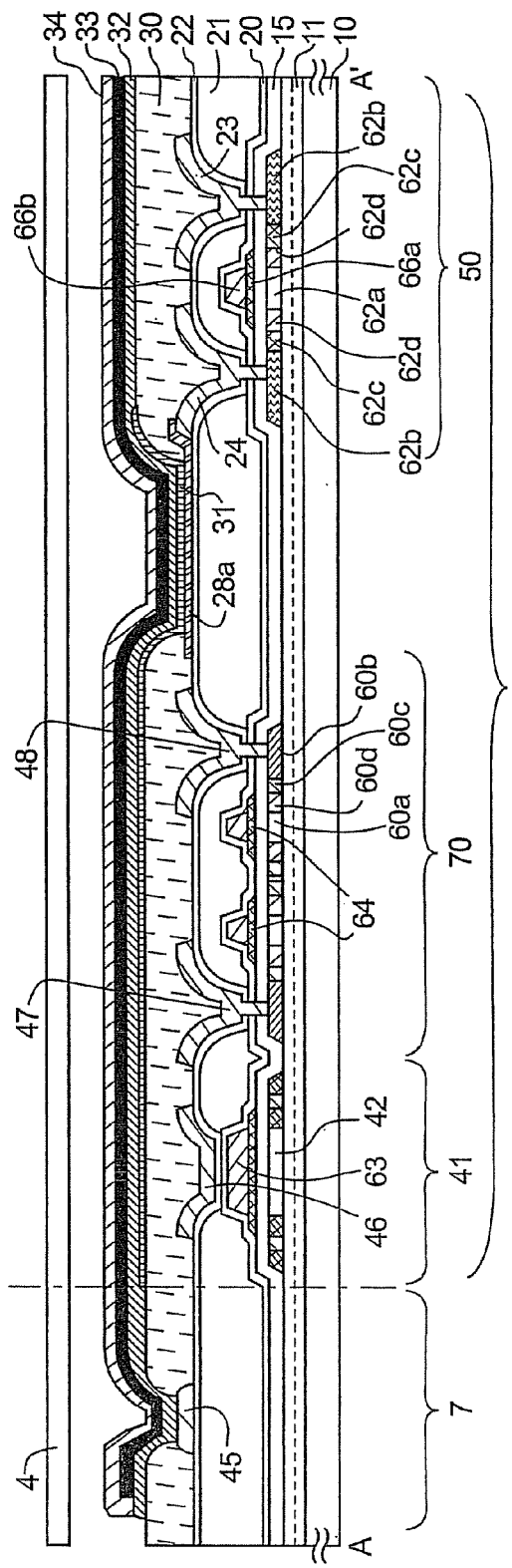

Next, the cross-sectional structure is described using FIG. 4(B). Driving circuits and pixel portions are formed on a substrate 10, but here the pixel portion 2 and the connection region 7 are shown. Also, in the present embodiment, a configuration is shown where a base film 11 that prevents pollutants from the substrate is disposed on the substrate 10, but it is not invariably necessary to dispose the base film 11.

The pixel portion 2 is formed by plural pixels including a switching transistor TFT 70, a capacitor 41, a current control TFT 50 connected to a first electrode, and a first electrode (anode) 28a serving as a lower electrode electrically connected to a drain region or a source region (high-density impurity regions) 62b of the current control TFT 50. Plural TFTs are formed on one pixel. In FIG. 4(B), an example using a p-channel type TFT that includes an upper layer 66b of a gate electrode and a channel forming region 62a that are superposed with a gate insulating film 15 sandwiched therebetween, a lower layer 66a of the gate electrode and low-density impurity regions 62d that are superposed with the gate insulating film 15 sandwiched therebetween, and low-density impurity regions 62c that are not superposed with the lower layer 66a of the gate electrode is shown for the current control TFT 50, but the current control TFT 50 is not limited thereto. An n-channel type TFT may also be used. One of the reference numerals 23 and 24 is a source electrode, and the other is a drain electrode, and 24 also is a connection electrode that connects the first electrode 28a and the high-density impurity regions 62b.

FIG. 4(B) shows a cross-sectional view of the current control TFT 50, the switching TFT 70 and the capacitor 41. In FIGS. 4, an example using, for the switching TFT 70, an n-channel type TFT including plural channel forming regions 60a superposed with the gate electrodes 64, with the gate insulating film 15 sandwiched therebetween, is shown, but the switching TFT 70 is not limited thereto. A p-channel type TFT may also be used. One of the reference numerals 47 and 48 is a source wiring, and the other is a drain wiring, 60b is a source region or a drain region, 60c are low-density impurity regions that are not superposed with the gate electrodes 64, and 60d are low-density impurity regions superposed with the gate electrodes 64. With respect to the capacitor 41, a retention capacity is formed by an electrode 46 and an electrode 63 using interlayer insulating films 20 and 22 as dielectrics, and a retention capacity is formed by the electrode 63 and a semiconductor film 42 using the gate insulting film 15 as a dielectric.

For the interlayer insulating films 20, 21 and 22, a photosensitive or non-photosensitive organic material (polyimide, acryl, polyamide, polyimideamide, a resist or benzocyclobutene), an inorganic material (silicon oxide, silicon nitride, silicon oxynitride, etc.) formed by sputtering, CVD or coating, or a laminate of these can be used.

In FIG. 4, an inorganic insulating film 20 comprising silicon nitride is disposed so as to cover the gate electrode and the gate insulating film 15. The inorganic insulating film 20 is an inorganic insulating film that is disposed for hydrogenation to terminate dangling bonds of the semiconductor layer by conducting film formation with the condition that hydrogen is included in the film and conducting heating. The semiconductor layer present underneath can be hydrogenated without relation to the presence of the gate insulating film comprising silicon oxide. Also, after a film of a photosensitive organic material is formed by coating to form the interlayer insulating film 21, the interlayer insulating film 21 is selectively etched by wet etching or dry etching so that the upper end portion thereof becomes a curved surface having a curvature radius. When an organic material is used as the interlayer insulating film 21, it is preferable to cover the interlayer insulating film 21 with an interlayer insulating film 22 comprising a silicon nitride film, a silicon oxide nitride film, an aluminum oxynitride film or a laminate of these to block the interlayer insulating film 21 so that moisture, gas or impurities from within the interlayer insulating film 21 are not diffused and do not cause the light-emitting element formed thereafter to deteriorate. The interlayer insulating film 22 can also block the diffusion of impurities from the substrate 10 to the light-emitting element and block the diffusion of impurities from the light-emitting element to the TFTs. When a hygroscopic organic material is used as the interlayer insulating film 21, it is necessary to rebake the organic material because it swells when it is exposed to a solution such as a stripper used in other patterning in a later process, but the interlayer insulating film 21 can be prevented from swelling by covering it with the interlayer insulating film 22.

Also, the order in which the interlayer insulating films are laminated and the process order are not limited to the order in which the interlayer insulating films shown in FIG. 4 are laminated or the process order of film formation and hydrogenation. For example, the interlayer insulating film 21 that prevents the diffusion of impurities may be formed on an interlayer insulating film for hydrogenation and hydrogenated, then a film of an organic resin material may be formed by coating, and the interlayer insulating film 22, whose upper end portion is formed by wet etching or dry etching as a curved surface having a curvature radius, may be formed. It is preferable to etch the organic resin film by wet etching because, when a film comprising an organic resin is dry-etched, a charge arises and there is the potential to alter the TFT characteristics. When an interlayer insulating film comprising a laminate of an inorganic insulating film and an organic resin film is etched, only the organic resin film is wet-etched, or the inorganic insulating film is dry-etched and then the organic resin film is formed and wet-etched.

When a photosensitive organic resin material is used as the interlayer insulating film 21, it is easy to form the curved surface having a curvature radius at the upper end portion as shown in FIG. 4, but a non-photosensitive organic resin material or inorganic material is used as the interlayer insulating film 22.

Also, because the present embodiment is a case where the light-emitting device is an undersurface emission type, it is preferable to use a transparent material for the interlayer insulating films 20 to 22.

Insulators (also called banks, dividers, barriers, mound, etc.) 30 are formed at both ends of the first electrode (anode) 28a, and a layer (also called an EL layer) 31 including an organic compound is formed on the first electrode (anode) 28a. At the time of deposition, the organic compound is first gasified by resistance heating and then dispersed in the direction of the substrate due to a shutter opening at the time of deposition. The gasified organic compound is dispersed upwards, passes through an open portion disposed in a metal mask and is deposited on the substrate so that the layer 31 including the organic compound serving as a light-emitting layer (including a hole transporting layer, a hole injecting layer, an electron transporting layer, an electron injecting layer) is formed. Because the layer 31 including the organic compound is extremely thin, it is preferable for the surface of the first electrode to be flat. For example, planarization may be conducted, before patterning or after patterning of the first electrode, by a process that chemically and mechanically polishes (representatively, the CMP technique) the surface of the first electrode. When CMP is conducted, the flatness of the first electrode can be further improved by conducting CMP to thin the film thickness of the electrode 24 or the insulators 30 or to give the end portions of the electrode 24 tapered shapes. When an organic resin film is used as the interlayer insulating film 21, in order to improve the flatness of the first electrode (anode) 28a, it is preferable to dispose an inorganic insulating film as the interlayer insulating film 22 to prevent the occurrence of cracks and suppress the occurrence of a non-light-emitting region immediately after manufacturing and the occurrence of point defects. Also, in order to improve the cleanliness of the surface of the first electrode, cleaning (brush cleaning or sponge cleaning) for cleaning off foreign matter is conducted before and after the formation of the insulators 30, so that the occurrence of dark spots and point defects are reduced.

As the first electrode (anode) 28a, a transparent conductive film (ITO (indium oxide tin oxide alloy), an indium oxide zinc oxide alloy ($In_2O_3$—ZnO), a zinc oxide (ZnO), etc.) may be used.

Also, as the insulators 30, a photosensitive or non-photosensitive organic material (polyimide, acryl, polyamide, polyimideamide, a resist or benzocyclobutene), an inorganic material (silicon oxide, silicon nitride, silicon oxynitride, etc.) formed by CVD, sputtering or coating, or a laminate of these can be used. Also, when a photosensitive organic material is used as the insulators 30, the photosensitive organic material can be broadly divided into two types—a negative type that becomes insoluble in the etchant due to photosensitive light and a positive type that becomes soluble in the etchant due to light—but both can be appropriately used.

When a negative-type photosensitive organic material is used as the insulators 30, it is easy to form the curved surface having a curvature radius at the upper end portion thereof, but when a positive-type photosensitive organic material is used, it becomes the cross-sectional shape of the insulators. Also, when the insulators 30 comprise an organic material, the insulators 30 may be covered with an inorganic insulating film (a silicon nitride film formed by sputtering, etc.).

Also, when an organic material is used as the insulators 30 or the interlayer insulating films 20 to 22, it is important to conduct heating in a vacuum and conduct deaeration in order to remove gas and moisture in the films, and it is preferable to conduct vacuum heating at 100° C. to 250° C. immediately before forming the layer 31 including the organic compound.

Also, when inorganic insulating films are used as the interlayer insulating films 20 to 22, the films may be formed using plasma CVD or sputtering. In particular, with a silicon nitride film where silicon is used as a target in RF sputtering, where the substrate temperature is room temperature to 350° C., where the film-forming pressure is 0.1 Pa to 1.5 Pa, and where high-frequency power (5 to 20 $W/cm^2$) of 13.56 MHz is applied so that the silicon nitride film is formed by only nitrogen gas or a mixed gas of nitrogen gas and argon gas, the blocking effect with respect to Na, Li and other elements belonging to Group 1 or Group 2 of the Periodic Table is extremely strong, and the diffusion of these movable ions and the like can be effectively suppressed. A metal film where 0.2 to 1.5 wt % (preferably 0.5 to 1.0 wt %) of lithium is added to aluminum is preferable for the cathode first layer used in the present embodiment with respect to the electron injecting property or for the rest. When a material including lithium is used as the cathode, there is the potential for the operation of the transistor to be adversely affected by the diffusion of the lithium, but lithium can be prevented from being diffused in the TFT if the material is a silicon nitride film formed by RF sputtering.

When the layer 31 including the organic compound is used as a full-color display, material layers specifically emitting red, green and blue light may be appropriately and selectively formed by deposition using a deposition mask or ink-jetting. When a layer including an organic compound 31 that emits green light is formed, in the present embodiment, a 60 nm α-NPD film is formed, a 40 nm $Alq_3$ film to which DMQD has been added is formed as a green light-emitting layer using the same deposition mask, a 40 nm $Alq_3$ film is formed as an electron transporting layer, and a 1 nm $CaF_2$ film is formed as an electron injecting layer. Also, when a layer including an organic compound 31 that emits blue light is formed, a 60 nm α-NPD film is formed, a 10 nm BCP film is formed as a blocking layer using the same mask, a 40 nm $Alq_3$ film is formed as an electron transporting layer, and a 1 nm $CaF_2$ film is formed as an electron injecting layer. Also, when a layer including an organic compound 31 that emits red light is formed, a 60 nm α-NPD film is formed, a 40 nm $Alq_3$ film to which DCM has been added is farmed as a red light-emitting layer using the same mask, a 40 nm $Alq_3$ film is formed as an electron transporting layer, and a 1 nm $CaF_2$ film is formed as an electron injecting layer.

Also, for white light emission, the device may be configured as a light-emitting display device with which full-color display is possible by separately disposing a color filter and a color conversion layer. When the device is to be used as a display device conducting only simple display or as an illumination device, the device can be configured to emit light of a single color (representatively, white light). For example, an electron-transporting 1,3,4-oxadiazole derivative (PBD) may be dispersed in hole-transporting polyvinylcarbazole (PVK). Also, white light emission can be obtained by dispersing 30 wt % of PBD as an electron-transporting agent and appropriately dispersing 4 types of pigments (TPB, coumarin 6, DCM 1, Nile red). It is also possible to obtain white light emission overall by appropriately selecting an organic compound film that emits red light, an organic compound film that emits green light and an organic compound film that emits blue light, and superposing and mixing the colors.

Also, a poly(ethylenedioxythiophene)/poly(styrene sulfonate aqueous solution (PEDOT/PSS), a polyaniline/camphor sulfonic acid aqueous solution (PANI/CSA), PTPDES, Et-PTPDEK or PPBA acting as a hole injecting layer (anode buffering layer) may be applied to the entire surface of the first electrode (anode) 28a and calcinated. When a hole injecting layer comprising a polymer material is formed by a coating method such as spin-coating, the flatness is improved, and the coverage and uniformity in film thickness of a film formed thereon can be made excellent. In particular, because the film thickness of the light-emitting layer becomes uniform, uniform light emission can be obtained. In this case, it is preferable to conduct vacuum heating (100 to 200° C.) immediately before film formation by deposition after the hole injecting layer has been formed by coating. For example, after the surface of the first electrode (anode) has been cleaned with a sponge, a poly(ethylenedioxythlophene)/poly(styrene sulfonate) aqueous solution (PEDOT/PSS) is coated on the entire surface of the first electrode to a film thickness of 60 nm, pre-calcinated at 80° C. for 10 minutes, calcinated at 200° C. for 1 hour, and then vacuum-heated (heated at 170° for 30 minutes and then cooled for 30 minutes) immediately prior to deposition, to form a light-emitting layer by deposition without coming into contact with the atmosphere. Particularly when unevenness and microparticles are present on the film surface of ITO, the affects thereof can be reduced by thickening the film thickness of the PEDOT/PSS.

Also, because the wettability of PEDOT/PSS is not very good when it is applied to the ITO film, it is preferable to improve the wettability by applying the PEDOT/PSS solution a first time by spin-coating and then cleaning the surface of the electrode with pure water, then again applying the PEDOT/PSS solution a second time by spin-coating, and conducting calcination to form a uniform film. The effects that the surface is modified by cleaning it with pure water after the first coating and microparticles can also be removed can be obtained.

Also, when a PEDOT/PSS film is formed by spin-coating, it is preferable to selectively remove end surfaces and peripheral portions of the substrate, terminal portions and connection regions between the cathode and the wiring underneath because the PEDOT/PSS is formed on the entire surface, and it is preferable to remove these with $O_2$ ashing.

Also, cathodes 32, 33 and 34 serving as an upper electrode are formed on the layer 31 including the organic compound. In order to reduce the number of pinholes resulting in dark spots, the cathodes are formed by laminating the layer 32, which comprises a conductive inorganic material, the layer 33, which comprises a conductive organic material, and the layer 34, which comprises a conductive inorganic material.

It is preferable for the conductive inorganic material forming the cathode first layer 32 to be a material whose electron donating property to the electron transporting layer and electron injecting layer is high and whose physical junction with the electron transporting layer and the electron injecting layer is excellent. Examples of metals that have a low work function and are stable include alkali metals and alkaline earth metals such as lithium, indium, magnesium, strontium, calcium, potassium, sodium and barium, and alloys with metals having a larger work function than that of aluminum such as aluminum and silver. Alloys of these and aluminum and metals having a larger work function than that of aluminum may also be laminated. In a case where excellent electrical contact with the organic compound layer is possible even if a metal not including an alkali metal or an alkaline earth metal is used for the cathode first layer, such as a case where the electron injection layer is doped with an alkali metal or an alkaline earth metal, a non-corrosive metal comprising aluminum, silver, iron, chromium, nickel, gallium, molybdenum, platinum, gold, carbon, iron, antimony, tin, tungsten, zinc, ruthenium, cadmium, tantalum, cobalt, arsenic, niobium, palladium and bismuth can be used. Also, alloys of these metals and laminates can be used. In the present embodiment, excellent EL element characteristics can be obtained even if a material having a relatively high work function is used as the first layer cathode because $CaF_2$ is used for the electron injecting layer. Here, aluminum is used as the cathode of the first layer.

Also, if the element is an upper surface emission type element, a transparent conductive film (ITO (indium oxide tin oxide alloy), an indium oxide zinc oxide alloy ($In_2O_3$—ZnO), a zinc oxide (ZnO), etc.) or a laminate of a transparent conductive film and a thin metal film can be used for the cathode first layer.

With respect to the film-forming method of the cathode first layer, it is preferable to conduct deposition using resistance heating or to use sputtering because, in deposition using an electron beam, the TFT is damaged by X-rays emitted at the time of deposition. Also, it is preferable for the deposition rate to be high when the cathode first layer is deposited using resistance heating. Because the kinetic energy of the substance being deposited is high, a finer film can be formed. Also, a finer film can be formed by forming the film using ion assist deposition. The cathode material of the first layer is not limited to the example given above, and it is possible to use various metals and alloys thereof.

Any material can basically be used to form the cathode second layer 33 as long as the material is a conductive organic material. However, in consideration of the ease of the film formation method, conductive resin such as poly(ethylenedioxythlophene)/poly(styrene sulfonate) aqueous solution (PEDOT/PSS), and polyvinyl carbazole (PVX), or an amorphous depositable material such as Alq3 or α-NPD used in EL layers is preferable. These material films are hygroscopic and substantially transparent if the film thickness is thin. In the present embodiment, it is preferable to use a material having high electron transportability as the conductive organic material because the upper electrode is used as a cathode. The conductive organic material can be doped with an alkali metal or alkaline earth metal such as lithium, indium, magnesium, strontium, calcium, potassium, sodium and barium, or a transition metal such as a rare earth metal, in order to improve the conductivity of the organic material and improve electrical contact with the inorganic material.

For the upper electrode second layer, it is preferable to form a film of a conductive resin by coating. By coating is meant spin-coating, spraying, screen printing or painting. By applying a conductive resin as the cathode second layer, not only pinholes resulting from crystal grain boundaries but also pinholes in the cathode resulting from base unevenness and foreign matter can be reduced and the cathode surface can be flattened. With this method, it is possible to suppress the occurrence of dark spots resulting from foreign matter and unevenness of the base. Also, it is thought that, because the cathode surface is flattened, coverage when conducting film sealing above the element becomes better. When a film of the conductive organic material is formed using coating, it is preferable to calcinate the film by vacuum heating after film formation.

An organic material that is depositable and conductive, such as $Alq_3$, α-NPD or BCP, can be used as the cathode of the second layer. Coverage with respect to foreign matter and ITO unevenness is not as good as that of a coated film, but pinholes resulting from crystal grain boundaries are reduced by using an amorphous film with no pinholes. By using an organic film that has good coverage in this case, it is possible to also reduce dark spots resulting from foreign matter and ITO unevenness. Also by using a conductive organic material other than the above, it is possible to reduce the number of pinholes.

In the case of an upper surface light-emitting element, it is necessary for the cathode of the second layer to be transparent in the visible light region.

As the cathode 34 of the third layer, it is preferable to use aluminum or a material having a higher work function than that of aluminum. Aluminum and the material having a higher work function than that of aluminum may be used singly or an alloy thereof may be used. It is also possible to use a laminate film of these.

It is preferable to form the cathode of the third layer by sputtering that can form a fine film. The cathode of the third layer can also be formed using deposition. When the cathode of the third layer is formed, it is preferable to form the film so that the end surfaces thereof are covered in order to prevent water and oxygen from penetrating the pixel portion from the end surfaces of the conductive organic material of the second layer. If a passivation film is present on the cathode, the end surfaces of the organic layer of the second layer may also be covered with the passivation film.

Thus, a light-emitting element comprising the first electrode 28a, the layer including the organic compound 31 and the second electrodes 32, 33 and 34 is formed. When the light-emitting element is an undersurface emission type, a color filter (here, unillustrated) comprising a coloring layer and BM is disposed on the substrate 10.

The second electrodes 32, 33 and 34 also function as wirings shared with all pixels and are electrically connected to the FPC 6 via the wirings. In FIG. 4, the connection region 7 that connects the wiring 45 to the second electrodes 32, 33 and 34 is shown, and this wiring is pulled around and electrically connected to the FPC.

Also, with respect to the terminal portions, a terminal electrode comprising a laminate of an electrode formed by the same process as the gate electrode, an electrode formed by the same process as the source electrodes or the drain electrodes and an electrode formed by the same process as the first electrode 28a is adhered to the FPC 6 with an adhesive such as a conductive adhesive. The configuration of the terminal portions is not particularly limited and may be appropriately formed.

The sealing substrate 4 is adhered with the sealing agent 5 including a filler in order to seal the light-emitting element formed on the substrate 10. A spacer comprising a resin film may also be disposed in order to secure an interval between the sealing substrate 4 and the light-emitting element. Additionally, the space inside the sealing agent 5 is filled with an inert gas such as nitrogen. It is preferable to use an epoxy resin as the sealing agent 5. It is also preferable for the sealing agent 5 to be a material that does not transmit moisture or oxygen as much as possible. Moreover, a material (desiccant, etc.) having the effect of absorbing oxygen and water may be disposed inside the space.

Also, in the present embodiment, other than a glass substrate or quartz substrate, a plastic substrate comprising FRP (Fiberglass-Reinforced Plastics), PVF (polyvinyl fluoride), Mylar, polyester or acryl and the like can be used as the material configuring the sealing substrate 4. It is also possible to seal with a sealing agent so as to cover the side surfaces (exposure surfaces) after the sealing substrate 4 has been adhered with the sealing agent 5.

By sealing the light-emitting element in a closed space as described above, the light-emitting element can be completely blocked from the outside, and substances that promote the deterioration of the organic compound layer, such as moisture and oxygen, can be prevented from penetrating from the outside.

Also, the present invention is not limited to the configuration of the switching TFT of the pixel portion of FIG. 4. For example, just the LDD regions 60c that do not overlap with the gate electrode may be disposed, via a gate insulating film, between the channel forming region 60a and the drain region (or the source region) 60b. The gate electrode shape is also not limited and may be a single-layer gate electrode.

Here, the invention was described using a top-gate type TFT as an example, but the invention can be applied without relation to a TFT structure. For example, it is possible to apply the invention to a bottom gate type (an inversely staggered type) TFT or a staggered type TFT.

Also, in FIG. 4, a configuration was described where the first electrode 28a was formed after the connection electrode 24 connected to the source region or the drain region was formed, but the invention is not particularly limited. For example, the connection electrode connected to the source region or the drain region may also be formed after the first electrode. An interlayer insulating film that covers the electrode connected to the source region or the drain regions may further disposed and a contact hole may be formed, and thereafter the first electrode connected to the electrode may be formed on the interlayer insulating film.

The source signal line driving circuit 1 that drives the EL element can be manufactured in the same manner as the pixel portion so that a CMOS circuit is formed where an n-channel type TFT and a p-channel type TFT are combined. The n-channel type TFT includes a gate electrode of an upper layer and a channel forming region that are superposed with a gate insulating film sandwiched therebetween, a gate electrode of a lower layer and low-density impurity regions that are superposed with the gate insulating film sandwiched between, low-density impurity regions that are not superposed with the gate electrode of the lower layer, and high-density impurity regions serving as a source region or a drain region.

Also, the p-channel type TFT includes a gate electrode of an upper layer and a channel forming region that are superposed with a gate insulating film sandwiched therebetween, a gate electrode of a lower layer and low-density impurity regions that are superposed with the gate insulating film sandwiched therebetween, low-density impurity regions that are not superposed with the gate electrode of the lower layer, and high-density impurity regions serving as a source region or a drain region. Also, the TFT forming the drive circuit may also be formed by a known CMOS circuit, PMOS circuit or NMOS circuit. Also, in the present embodiment, a driver integrated type where the driving circuit was formed on the substrate was described, but this is not invariably necessary. The driving circuit can also be formed on the outside rather than on the substrate.

The invention claimed is:

1. A light-emitting device comprising:
    a first electrode;
    an EL layer over the first electrode; and
    a second electrode over the EL layer,
    wherein the second electrode comprises:
        a first film comprising an inorganic material over the EL layer;
        a second film comprising an organic material over the first film; and
        a third film comprising an inorganic material over the second film.

2. A light emitting device according to claim 1, wherein the first film is one of a metal film, a transparent conductive film, and a laminate of a metal film and a transparent conductive film.

3. A light emitting device according to claim 1, wherein the third film is one of a metal film, a transparent conductive film, and a laminate of a metal film and a transparent conductive film.

4. A light emitting device according to claim 1, wherein the third film comprises an alloy of aluminum and one of alkali metal and alkaline earth metal.

5. A light emitting device according to claim 1, wherein the second film is a conductive resin film.

6. A light emitting device according to claim 1, wherein the second film includes at least one of alkali metal and alkaline earth metal.

7. A light-emitting device comprising:
    a first electrode;
    an EL layer over the first electrode; and
    a second electrode over the EL layer,
    wherein the second electrode comprises:
        a first film comprising an inorganic material over the EL layer;
        a second film comprising an organic material over the first film; and
        a third film comprising an inorganic material over the second film, and
    wherein an end surface of the second film is covered by the third film.

8. A light emitting device according to claim 7, wherein the first film is one of a metal film, a transparent conductive film, and a laminate of a metal film and a transparent conductive film.

9. A light emitting device according to claim 7, wherein the third film is one of a metal film, a transparent conductive film, and a laminate of a metal film and a transparent conductive film.

10. A light emitting device according to claim 7, wherein the third film comprises an alloy of aluminum and one of alkali metal and alkaline earth metal.

11. A light emitting device according to claim 7, wherein the second film is a conductive resin film.

12. A light emitting device according to claim 7, wherein the second film includes at least one of alkali metal and alkaline earth metal.

13. A light-emitting device comprising:
a first substrate:
a first electrode over the first substrate;
an EL layer over the first electrode;
a second electrode over the EL layer; and
a second substrate over the second electrode,
wherein the second electrode comprises:
   a first film comprising an inorganic material over the EL layer;
   a second film comprising an organic material over the first film; and
   a third film comprising an inorganic material over the second film,
wherein an end surface of the second film is covered by the third film, and
wherein an emission light from the EL layer is transmitted and emitted through the first substrate.

14. A light emitting device according to claim 13, wherein the first film is one of a metal film, a transparent conductive film, and a laminate of a metal film and a transparent conductive film.

15. A light emitting device according to claim 13, wherein the third film is one of a metal film, a transparent conductive film, and a laminate of a metal film and a transparent conductive film.

16. A light emitting device according to claim 13, wherein the third film comprises an alloy of aluminum and one of alkali metal and alkaline earth metal.

17. A light emitting device according to claim 13, wherein the second film is a conductive resin film.

18. A light emitting device according to claim 13, wherein the second film includes at least one of alkali metal and alkaline earth metal.

19. A light-emitting device comprising:
a first substrate:
a first electrode over the first substrate;
an EL layer over the first electrode;
a second electrode over the EL layer; and
a second substrate over the second electrode,
wherein the second electrode comprises:
   a first film comprising an inorganic material over the EL layer;
   a second film comprising an organic material over the first film; and
   a third film comprising an inorganic material over the second film,
wherein an end surface of the second film is covered by the third film, and
wherein an emission light from the EL layer is transmitted and emitted through the second substrate.

20. A light emitting device according to claim 19, wherein the first film is one of a metal film, a transparent conductive film, and a laminate of a metal film and a transparent conductive film.

21. A light emitting device according to claim 19, wherein the third film is one of a metal film, a transparent conductive film, and a laminate of a metal film and a transparent conductive film.

22. A light emitting device according to claim 19, wherein the third film comprises an alloy of aluminum and one of alkali metal and alkaline earth metal.

23. A light emitting device according to claim 19, wherein the second film is a conductive resin film.

24. A light emitting device according to claim 19, wherein the second film includes at least one of alkali metal and alkaline earth metal.

25. A light-emitting device comprising:
a transistor;
a first electrode electrically connected to the transistor;
an EL layer over the first electrode; and
a second electrode over the EL layer,
wherein the second electrode comprises:
   a first film comprising an inorganic material over the EL layer;
   a second film comprising an organic material over the first film; and
   a third film comprising an inorganic material over the second film, and
wherein an end surface of the second film is covered by the third film.

26. A light emitting device according to claim 25, wherein the first film is one of a metal film, a transparent conductive film, and a laminate of a metal film and a transparent conductive film.

27. A light emitting device according to claim 25, wherein the third film is one of a metal film, a transparent conductive film, and a laminate of a metal film and a transparent conductive film.

28. A light emitting device according to claim 25, wherein the third film comprises an alloy of aluminum and one of alkali metal and alkaline earth metal.

29. A light emitting device according to claim 25, wherein the second film is a conductive resin film.

30. A light emitting device according to claim 25, wherein the second film includes at least one of alkali metal and alkaline earth metal.

* * * * *

UNITED STATES PATENT AND TRADEMARK OFFICE
CERTIFICATE OF CORRECTION

PATENT NO. : 8,450,924 B2
APPLICATION NO. : 13/091423
DATED : May 28, 2013
INVENTOR(S) : Kaoru Tsuchiya Page 1 of 1

It is certified that error appears in the above-identified patent and that said Letters Patent is hereby corrected as shown below:

In the Specification:

Column 9, line 45; Change "insulating film comprising" to --insulating film 15 comprising--.
Column 12, line 3; Change "is farmed as" to --is formed as--.
Column 12, line 24-25; Change "(styrene sulfonatec aqueous" to --(styrene sulfonate) aqueous--.
Column 12, line 40; Change "poly(ethylenedioxythlophene)/poly" to --poly(ethylenedioxythiophene)/poly--.
Column 13, line 57-58; Change "poly(ethylenedioxythlophene)/poly" to --poly(ethylenedioxythiophene)/poly--.
Column 13, line 59; Change "(PVX)," to --(PVK),--.
Column 15, line 50; Change "further disposed and" to --further be disposed and--.

Signed and Sealed this
Fifth Day of November, 2013

Teresa Stanek Rea
*Deputy Director of the United States Patent and Trademark Office*